United States Patent
Lam et al.

(10) Patent No.: US 7,841,078 B2
(45) Date of Patent: Nov. 30, 2010

(54) METHOD OF OPTIMIZING LAND GRID ARRAY GEOMETRY

(75) Inventors: Roger Lam, Fishkill, NY (US); Wai Mon Ma, Poughkeepsie, NY (US); Arch F. Nuttall, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 278 days.

(21) Appl. No.: 11/970,346

(22) Filed: Jan. 7, 2008

(65) Prior Publication Data
US 2009/0172941 A1 Jul. 9, 2009

(51) Int. Cl.
*H05K 3/30* (2006.01)
*H01L 23/495* (2006.01)

(52) U.S. Cl. ............................. 29/832; 29/825; 29/840; 257/675; 439/67

(58) Field of Classification Search ................... 29/825, 29/832, 840; 257/675; 439/67
See application file for complete search history.

(56) References Cited

U.S. PATENT DOCUMENTS 5,575,662 A * 11/1996 Yamamoto et al. ............ 439/67
6,172,422 B1 * 1/2001 Chigawa et al. .............. 257/778
6,433,410 B2 * 8/2002 Tanioka et al. ............... 257/675
2001/0033010 A1 * 10/2001 Tanioka et al. ............... 257/675

FOREIGN PATENT DOCUMENTS

| JP | 02273985 A | 11/1990 |
|---|---|---|
| JP | 2000-304768 | 11/2000 |
| WO | WO99/38368 | 7/1999 |

* cited by examiner

*Primary Examiner*—C. J Arbes
(74) *Attorney, Agent, or Firm*—Stephen Bongini; Fleit Gibbons Gutman Bongini & Bianco PL (57) ABSTRACT

Disclosed is a method, system, and computer program storage product for optimizing land grid array site geometry on an electronic assembly mounting. A first member including at least one convex region is aligned with a first portion of an electronic assembly mounting. A second member is aligned with a second portion of the electronic assembly mounting. The second portion includes at least one concave region corresponding to the convex region of the first portion. The second member includes a dome-shaped region having a predefined geometry. Heat is applied to at least one of the electronic assembly mounting, the first member, and the second member. Pressure is applied to at least one of the first member and the second member to reshape the convex region into a substantially flat surface. Applying pressure also reshapes the concave region into a geometry corresponding to the predefined geometry of the dome-shaped region.

7 Claims, 6 Drawing Sheets

METHOD OF OPTIMIZING LAND GRID ARRAY GEOMETRY

FIELD OF THE INVENTION

The present invention generally relates to the field of electronic assembly mounting, and more particularly relates to land grid array site geometry for electronic assemblies.

BACKGROUND OF THE INVENTION

Current manufacturing processes for electronic assembly mountings, such as printed circuit board manufacturing processes, produce variations in the flatness of Land Grid Array ("LGA") sites. These variations occur because of the natural dynamics of the resin flow during the circuit board lamination process. Attempts to control the lamination process to achieve a constant LGA site geometry have not been successful. Flatness variations in LGA sites occur on circuit boards laminated by raw card suppliers and can occur within the same board. These flatness variations resemble either a convex or a concave dish geometry in the LGA site.

Current methods of compensating for such flatness variations utilize a customized LGA insulated backer with varying film thickness for each printed circuit board. Varying film thicknesses are required to compensate for the varying dish shape geometry in the LGA site. The function of the customized insulated backer is to act like a shim that is pushed against the dish shape geometry on the circuit board. This provides uniform loading to the LGA interposer and module.

One drawback with using such a customized insulated backer is that for each circuit board a customized insulated backer is required. This holds true even for different circuit boards of the same model of printed circuit board. Because multiple backers exist for a single printed circuit board model, an assembler can end up using an incorrect backer for an LGA site. An incorrect backer applied to an LGA site can cause reliability problems and failures during use. A reliability failure can occur because of a cracked module due to higher stress from an over compensation of film thickness on the insulated backer, or intermittent opens can occur due to an inadequate load caused by an under compensation of film thickness.

SUMMARY OF THE INVENTION

In one embodiment a method for optimizing land grid array site geometry on an electronic assembly mounting is disclosed. The method includes aligning a first member with a first portion of an electronic assembly mounting. The first portion includes at least one convex region. A second member is aligned with a second portion of the electronic assembly mounting. The second portion includes at least one concave region corresponding to the convex region of the first portion. The second member includes a dome-shaped region having a predefined geometry. Heat is applied to at least one of the electronic assembly mounting, the first member, and the second member. Pressure is applied to at least one of the first member and the second member, so as to reshape the convex region into a substantially flat surface. Applying pressure also reshapes the concave region into a geometry corresponding to the predefined geometry of the dome-shaped region of the second member.

In another embodiment, a system for optimizing land grid array site geometry on an electronic assembly mounting is disclosed. The system includes an electronic assembly mounting, a first member, a second member, and an optimization controller communicatively coupled to the first member and the second member. The optimization controller is adapted to align a first member with a first portion of an electronic assembly mounting. The first portion includes at least one convex region. A second member is aligned with a second portion of the electronic assembly mounting. The second portion includes at least one concave region corresponding to the convex region of the first portion. The second member includes a dome-shaped region having a predefined geometry. Heat is applied to at least one of the electronic assembly mounting, the first member, and the second member. Pressure is applied to at least one of the first member and the second member, so as to reshape the convex region into a substantially flat surface. Applying pressure also reshapes the concave region into a geometry corresponding to the predefined geometry of the dome-shaped region of the second member.

In yet another embodiment, a computer program storage product for optimizing land grid array site geometry on an electronic assembly mounting is disclosed. The computer program storage product includes instructions for aligning a first member with a first portion of an electronic assembly mounting. The first portion includes at least one convex region. A second member is aligned with a second portion of the electronic assembly mounting. The second portion includes at least one concave region corresponding to the convex region of the first portion. The second member includes a dome-shaped region having a predefined geometry. Heat is applied to at least one of the electronic assembly mounting, the first member, and the second member. Pressure is applied to at least one of the first member and the second member, so as to reshape the convex region into a substantially flat surface. Applying pressure also reshapes the concave region into a geometry corresponding to the predefined geometry of the dome-shaped region of the second member.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

Embodiments of the present invention utilize a single insulated baker plate that is universal to one or more printed circuit board ("PCB") models. More generally, the present invention is applicable to any electronic assembly mounting having a substrate with a glass transition temperature. For example, the present invention is also applicable to Laminate Area Array Modules that utilize LGA chip attachment methods. PCBs are only used in this description as one example of such an electronic assembly mounting. Land grid array ("LGA") raw boards from various suppliers can be optimized to predetermined dish geometry utilizing the universal insulated backer plate. This allows for a single universal insulated backer plate to be used for a particular PCB model type. The universal insulated backer plate prevents the incorrect backer plate from being used with a PCB, and increases raw card yields at the supplier. Also, the universal insulated backer plate prevents a PCB from being rejected due to non-conforming LGA dish geometries.

Land Grid Array Site Geometry

Figure 1:
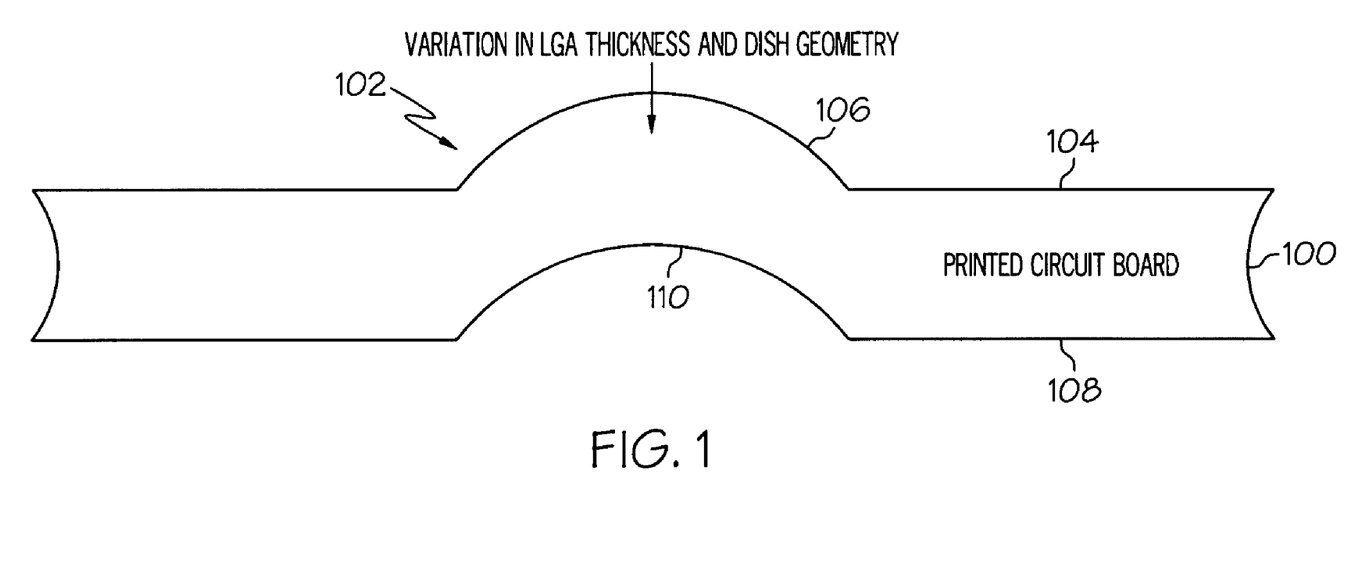
FIG. 1 is a cross-sectional view of a printed circuit board.

FIG. 1 shows a cross-sectional view of a printed circuit board 100. This embodiment is illustrated only as an exemplary electronic assembly mounting. The present invention is applicable to many other electronic assembly mountings as explained above. In computer and electronic system structures, an electronic module (such as a Central Processing Unit ("CPU"), a memory module, an ASIC, or other semiconductor device) is connected to the PCB 100. In connecting an electronic module to the PCB 100 using a land grid array interconnect scheme, individual electrical contacts on the base of the electronic module are connected to a set of corresponding individual electrical contacts (or "lands") on the PCB 100. This set of contacts on the PCB that is dedicated to receiving the electronic module contacts is known as a Land Grid Array ("LGA") site 102.

The LGA interconnect scheme provides a high-interconnect-density electronic interface. An LGA site also provides a highly-reliable socket interconnect structure that permits mounting of semiconductor device packages having much different thermal expansion properties than the electronic assembly mounting area (such as the PCB 100). For example, ceramic semiconductor device packages generally have a much lower coefficient of thermal expansion than the PCB, so typical solder-ball mounting (such as Ball Grid Array) leads to fracture of the solder ball connections when temperatures vary widely, causing failure of the electronic system. The LGA interconnect scheme also permits interchangeable integrated circuit mounting without using pin-based interconnects. For present-day computing systems, this allows processing components to be mounted using a socket configuration rather than mounted via a solder interconnect so that the processing components may be selected and easily installed after an electronic assembly such as a "motherboard" has been fabricated.

Figure 4:
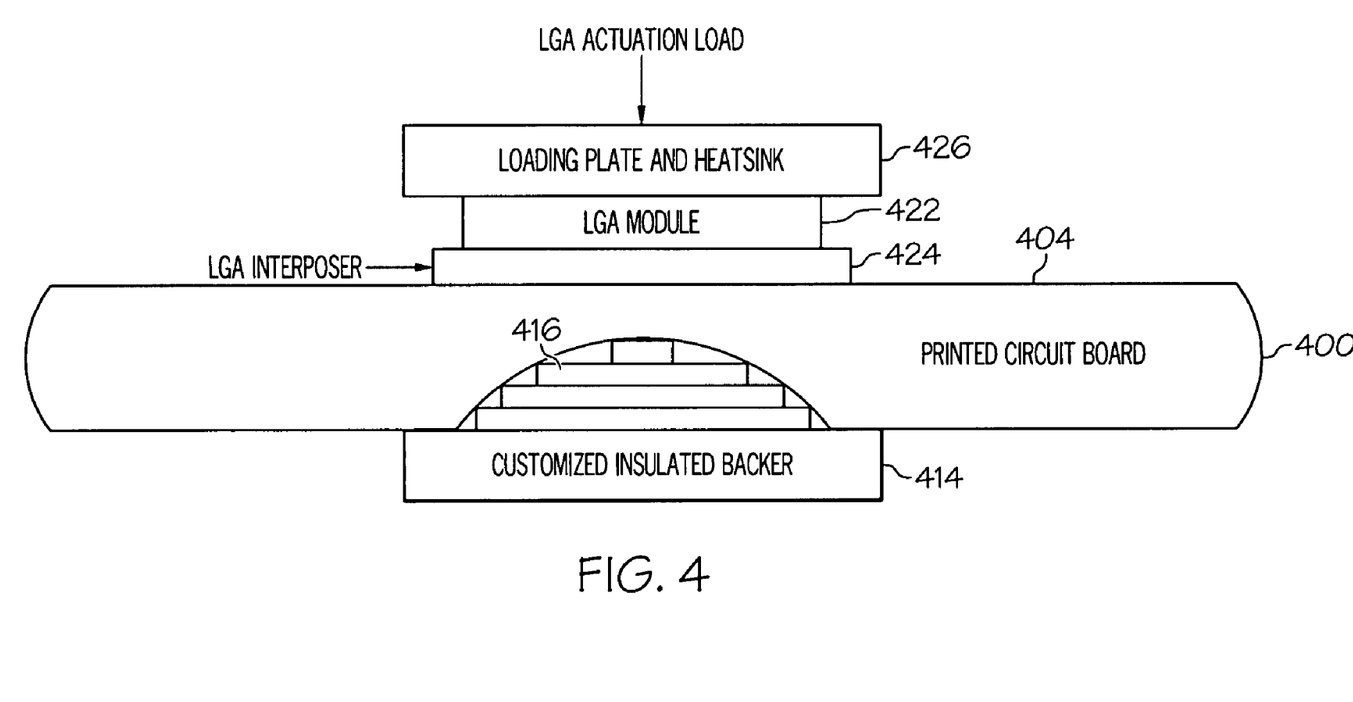
FIG. 4 shows a printed circuit board assembly using a printed circuit board that has undergone land grid array site geometry optimization in accordance with an embodiment of the present invention.

The LGA site 102 can also include an LGA interposer, as shown in FIG. 4. An LGA interposer is used to interconnect a semiconductor device package having LGA terminals to lands on a system substrate, such as the PCB 100. The LGA interposer provides electrical connections between each of LGA terminals and the corresponding land via electrically-conductive contacts.

This exemplary PCB 100 is formed by the lamination of multiple substrate cores interconnected by plated through-holes ("PTH's") formed in apertures in the cores. Each PTH is in turn electrically connected to an upper surface contact area on the PCB 100. In laminating the cores, a large amount of substrate material, such as epoxy resin, is required to fill in the apertures. Because of the amount of resin that is consumed in filling the apertures, the upper surface 104 of this manufactured PCB structure 100 has a slight convex or "dish-up" configuration 106 in the area defining the LGA site 102. The bottom surface 108 of the PCB 100 has a corresponding concave or "dish-down" configuration 110. Although only one area on the PCB 100 is shown as having varying flatness characteristics, multiple areas across the PCB 100 can have such characteristics.

LGA Site Geometry Optimization

Figure 2:
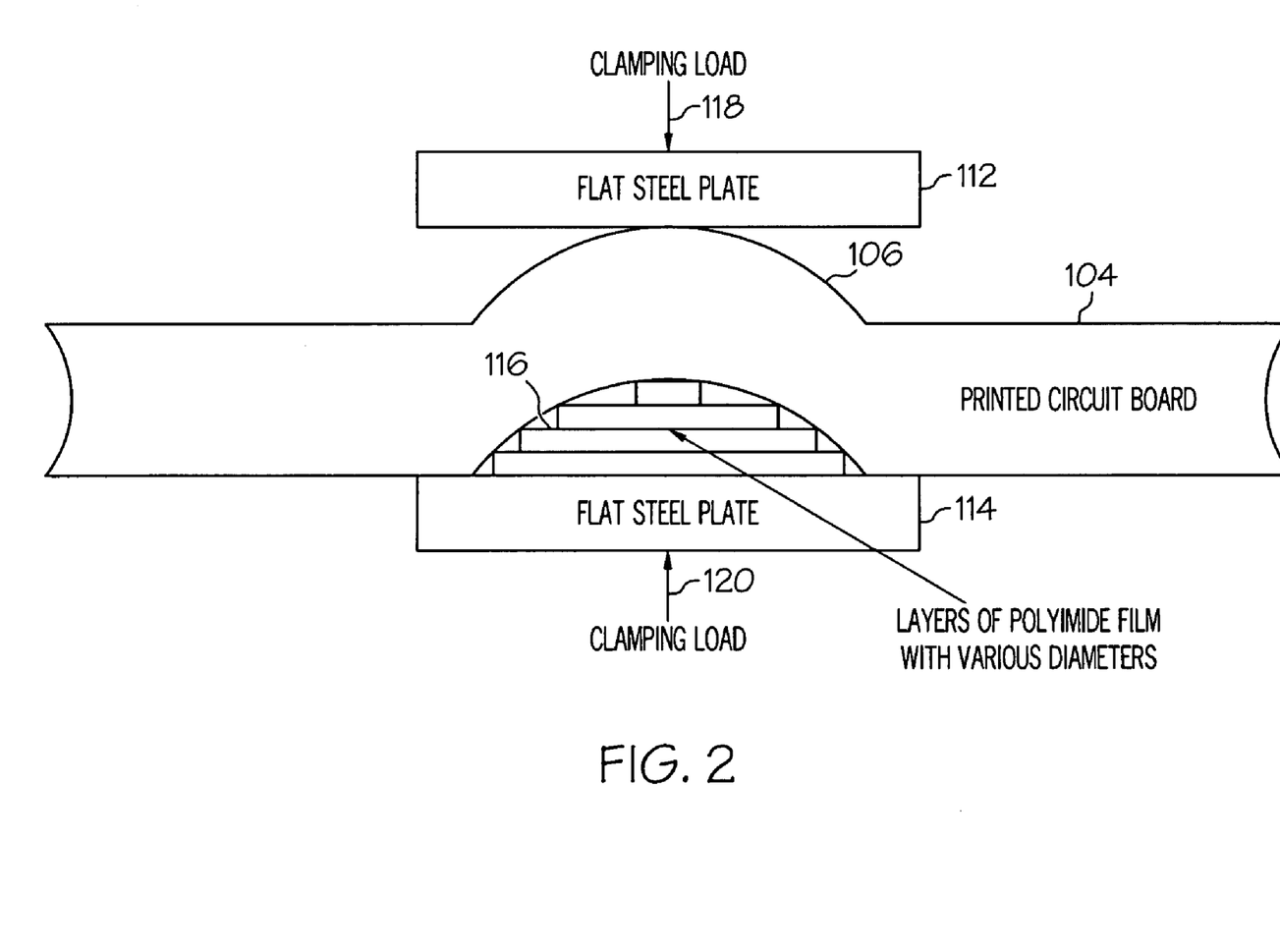
FIG. 2 illustrates a system for optimizing land grid array site geometry according to one embodiment of the present invention.

FIG. 2 illustrates an LGA site geometry optimization process according to one embodiment of the present invention. As shown in FIG. 2, the PCB 100 has the dish-up/dish-down 106 and 110 region. In this embodiment, a first member 112, such as a first plate, is situated above the dish-up 106 region(s) of the PCB 100. A second member 114, such as a second plate, is situated below the dish-down region(s) 110. The first and second plates 112 and 114 are comprised of steel, alloys, composites, or any combination thereof.

In this embodiment, the first plate has a substantially flat configuration, while the second plate 114 is made with a dome-shaped geometry. As shown, a dome-shaped region 116 extends in an upwardly fashion from an upper surface 118 of the second plate 114. The dome region 116 is machined into the second plate 114. Alternatively, the dome region 116 is formed by depositing material onto the second plate 114. For example, in the illustrated embodiment polyimide films are deposited onto the second plate 114 so as to create layers of varying thicknesses of polyimide film on the upper surface of the second plate 114. The present invention is not limited to polyimide films, any other material such as (but not limited to) steel alloys, aluminum alloys, copper alloys, or any combination thereof, can be deposited to create the dome region 116.

The second plate 114 with the dome region 116 is a universal die 115 for creating a consistent LGA site geometry. With consistent site geometries, customized insulated backer plates for each PCB 100 are not required. A single universal die 114 can be used with multiple PCBs 100 to create a common LGA site geometry across those multiple PCBs 100.

In this embodiment, a clamping load 118 is applied to the first plate 112 and a clamping load 120 is applied to the second plate 114 (universal die 115). The PCB 100 and the plates 112 and 114 are heated to the glass transition temperature of the raw card material of the PCB 100. For example, the PCB assembly 100 with the clamped pates 112 and 114 can be placed into an oven, coupled to heating elements, or the like. The heating process softens the PCB 100 so that the clamping pressure causes the first and second plates 112 and 114 to reform the PCB 100 to a particular configuration that matches the geometry of the plates 112 and 114.

Figure 3:
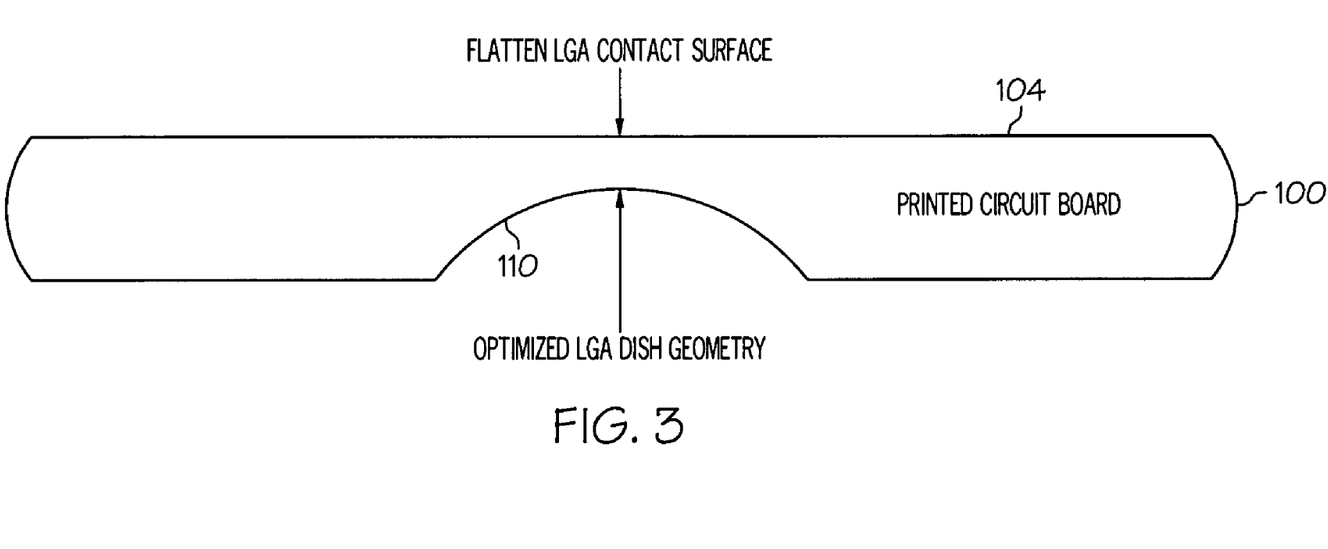
FIG. 3 is a cross-sectional view of a printed circuit board after land grid array site geometry optimization has been performed in accordance with an embodiment of the present invention.

In this embodiment, the pressure applied by the first plate 112 creates a substantially flat upper surface 104 of the PCB 100, as shown in FIG. 3. Stated differently, the first plate 112 flattens out the dish-up region(s) 106 of the PCB 100. The dish-up region(s) 106 is flattened out to substantially the same geometry as the other portions of the upper surface 104 of the PCB 100. The pressure applied by the universal die 115 (i.e., the second plate 114 with the dome region 116) to the dish-down region 110 creates a concave geometry of a given configuration, as shown in FIG. 3. Thus, multiple PCBs of a particular model type, and even PCBs from different suppliers, can be optimized so as to all have predetermined dish geometry at the LGA sites. This allows for a single universal insulated backer plate to be used for a particular PCB model type.

The present invention is not limited to using a first plate 112 and a second plate 114 to "sandwich" the PCB 100. In other embodiments, a downward force is applied to the first plate 112 while the second plate 114 remains stationary. This results in the second plate 114 exerting an opposite and equal force to the PCB 100.

Alternatively, an upward force can be applied to the second plate 114 while the first plate 112 remains stationary. This results in the first plate 112 exerting an opposite and equal force to the PCB 100. Also, the force applied to the plates 112 and 114 is not limited to a clamping force. A transitional force can also be applied. For example, in one embodiment, while the PCB 100 is heated a force is applied to the first and/or second plate causing the plates to apply pressure to the PCB 110, so as to reform the geometry of the dish-up/dish-down regions.

FIG. 4 shows an LGA module under uniform loading after the LGA site geometry optimization process of an embodiment of the present invention has been performed. As shown, the a PCB 400 has a substantially flat upper surface 404, and in its lower surface has a dish-down region 410 conforming to the dish geometry of a customized insulated backer plate 414 with the dome region 416 (universal die). This exemplary assembly also includes an LGA interposer 424 that interconnects a semiconductor package, in the form of LGA module 422 having multiple LGA terminals, to lands on the PCB 100. A loading plate and heatsink 426 are situated on top of the LGA module 422. The heatsink 426 provides heat transfer for the LGA module 422. The loading plate uniformly spreads the activation load (i.e., the load required to make electrical contact between the LGA module 422 and circuitry on the PCB 100) across the LGA module 422.

While illustrated for purposes of explanation, the present invention is not limited to an electronic assembly mounting having a dish-up/dish-down configuration as shown in FIG. 2. For example, the present invention is also applicable to a dish-down/dish-up configuration. In such an embodiment, the location of the components shown in FIG. 4 is reversed to perform the geometry optimization process on the dish-down/dish-up configuration.

Information Processing System

Figure 5:
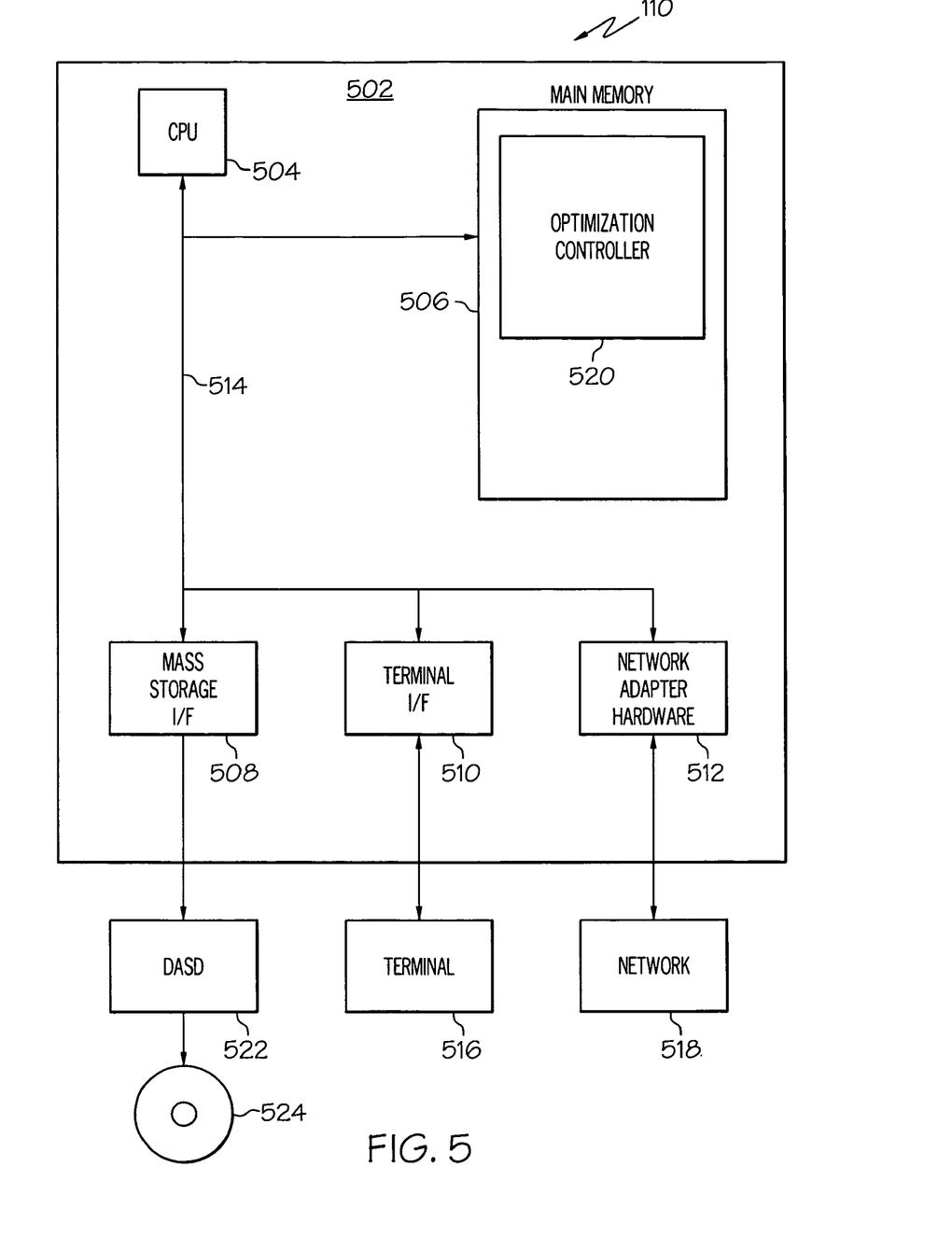
FIG. 5 is a block diagram illustrating an information processing system for controlling a land grid array site geometry optimization process according to one embodiment of the present invention.

FIG. 5 is a block diagram illustrating an information processing system for controlling an LGA site geometry optimization process according to one embodiment of the present invention. The information processing system is a suitably configured processing system adapted to implement a process according to an embodiment of the present invention. Any suitably configured processing system is able to be used in embodiments of the present invention, such as a personal computer, workstation, or the like.

The illustrated information processing system 500 includes a computer 502. The computer 502 has a processor 504 that is connected to a main memory 506, a mass storage interface 508, a terminal interface 510, and network adapter hardware 512. A system bus 514 interconnects these system components. The mass storage interface 508 is used to connect mass storage devices, such as data storage device 522, to the information processing system 500. One specific type of data storage device is a floppy disk drive that can store data to and read data from a computer readable medium, such as an optical disk 524 or a magnetic disk. Another type of data storage device is a hard disk drive configured to support, for example, NTFS type file system operations.

The main memory 506, in this embodiment, includes an optimization controller 520 for controlling the LGA site geometry optimization process. Although illustrated as concurrently resident in the main memory 506, components of the optimization controller 520 are not required to be completely resident in the main memory 506 at all times or even at the same time. In this embodiment, the information processing system 500 utilizes conventional virtual addressing mechanisms to allow programs to behave as if they have access to a large, single storage entity, referred to as computer system memory, instead of access to multiple, smaller storage entities such as the main memory 506 and data storage device 522. The term "computer system memory" thus generically refers to the entire virtual memory of the information processing system 500.

Although only one CPU 504 is illustrated for computer 502, computer systems with multiple CPUs can be used equally effectively. This embodiment of the present invention further incorporates interfaces that each includes separate, fully programmed microprocessors that are used to off-load processing from the CPU 504. Terminal interface 510 is used to directly connect one or more terminals 516 to computer 502 to provide a user interface to the computer 502. These terminals 516, which are able to be non-intelligent or fully programmable workstations, are used to allow system administrators and users to communicate with the information processing system 500. The terminal 516 is also able to be a user interface and peripheral devices that are connected to computer 502 and controlled by terminal interface hardware included in the terminal interface 510 that includes video adapters and interfaces for keyboards, pointing devices, and the like.

An operating system is included in the main memory, and is preferably a suitable multitasking operating system such as the Linux, UNIX, Windows XP, or Windows Server 2001 operating system. Further embodiments of the present invention use any other suitable operating system. Some embodiments of the present invention utilize architectures, such as an object oriented framework mechanism, that allows instructions of the components of operating system to be executed on any processor located within the information processing system 500. The network adapter hardware 512 is used to provide an interface to a network 518. Embodiments of the present invention are able to be adapted to work with any data communications connections including present day analog and/or digital techniques or via a future networking mechanism.

Although this exemplary embodiment of the present invention is described in the context of a fully functional computer system, further embodiments are capable of being distributed as a program product via a tangible computer readable medium such as a CD, DVD, diskette, flash memory device, or other form of recordable media, or via any type of electronic transmission mechanism.

Process of Optimizing LGA Site Geometry

Figure 6:
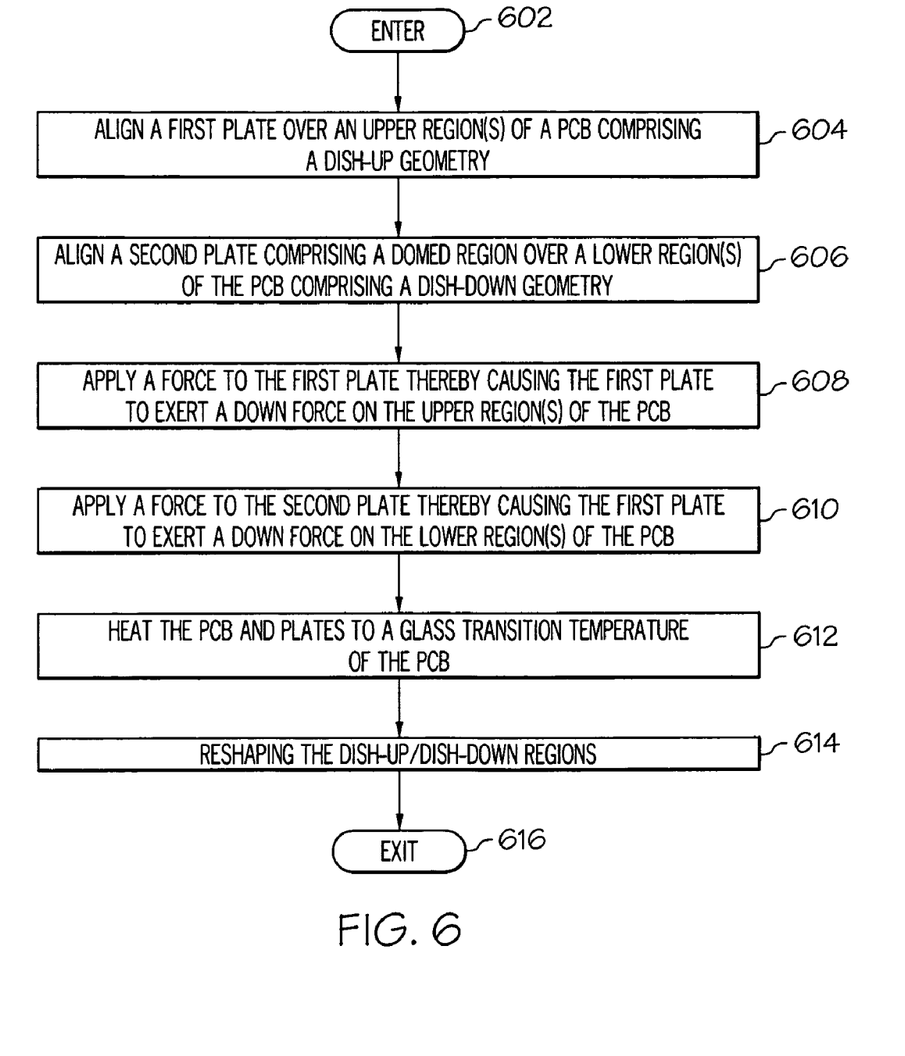
FIG. 6 illustrates a process for optimizing land grid array site geometry according to one embodiment of the present invention.

FIG. 6 illustrates an exemplary process of optimizing LGA site geometry according to one embodiment of the present invention. The operational flow diagram of FIG. 6 begins at step 602 and flows directly to step 604. A first plate 112, at step 604, is aligned over an upper region(s) of a PCB 100 having a dish-up geometry 106. A second plate 114, at step 606, is aligned over a lower region(s) of a PCB 100 comprising a dish-down geometry 110. A force 118, at step 608, is applied to the first plate 112, so as to cause the first plate 112 to exert a downward force on the upper region(s) of the PCB 100. A force 120, at step 610, is applied to the second plate 114, so as to cause the second plate 112 to exert an upward force on the lower region(s) of the PCB 100. The PCB 100 and plates 112 and 114, at step 612, are heated to the glass transition temperature of the PCB 100. The dish-up/dish-down regions 106 and 110, at step 614, are then reshaped according to the dish geometry of the plates 112 and 114. The control flow then exits at step 616.

Embodiments of the present invention can be implemented in hardware or software, or in a combination of hardware and software. For example, one embodiment of the present invention is implemented in hardware such as that used for assembling electronic assembly mounting areas such as (but not limited to) PCB boards. In another embodiment, the present invention is implemented in software such as that used for controlling and performing the assembly of electronic assembly mounting areas, such as PCB boards.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library, and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method for optimizing land grid array site geometry on an electronic assembly mounting, the method comprising the steps of:

aligning a first member with a first portion of an electronic assembly mounting, the first portion comprising at least one convex region;

aligning a second member with a second portion of the electronic assembly mounting, the second portion comprising at least one concave region corresponding to the convex region of the first portion, the second member including a dome-shaped region having a predefined geometry;

applying heat to at least one of the electronic assembly mounting, the first member, and the second member; and applying pressure to at least one of the first member and the second member, so as to reshape the convex region into a substantially flat surface and so as to reshape the concave region into a geometry corresponding to the predefined geometry of the dome-shaped region of the second member.

2. The method of claim 1, further comprising the step of repeating the steps of aligning the first member, aligning the second member, applying heat, and applying pressure on a plurality of electronic assembly mountings.

3. The method of claim 1, wherein the first member is a plate having a substantially flat lower surface.

4. The method of claim 3, wherein the second member is a plate comprising an upper surface that is substantially flat with a dome-shaped region.

5. The method of claim 4, wherein the first and second members are formed of steel or a steel alloy.

6. A method, for optimizing land grid array site geometry on an electronic assembly mounting, the method comprising the steps of:

aligning a first member with a first portion of an electronic assembly mounting, the first portion comprising at least one convex region;

aligning a second member with a second portion of the electronic assembly mounting, the second portion comprising at least one concave region corresponding to the convex region of the first portion, the second member including a dome-shaped region having a predefined geometry;

applying heat to at least one of the electronic assembly mounting, the first member, and the second member; and applying pressure to at least one of the first member and the second member, so as to reshape the convex region into a substantially flat surface and so as to reshape the concave region into a geometry corresponding to the predefined geometry of the dome-shaped region of the second member, wherein the dome-shaped region of the second member comprises a plurality layers of polyimide, at least two of the layers having different thicknesses.

7. The method of claim 1, wherein the step of applying pressure comprises applying pressure to both the first member and the second member.

* * * * *